United States Patent
Walia et al.

(10) Patent No.: US 7,844,234 B2
(45) Date of Patent: Nov. 30, 2010

(54) DEVICE, SYSTEM, AND METHOD OF PROVIDING BIASING POWER

(75) Inventors: Ravinder Walia, Chandler, AZ (US); Alberto Costantini, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 567 days.

(21) Appl. No.: 11/968,206

(22) Filed: Jan. 2, 2008

(65) Prior Publication Data
US 2009/0170453 A1 Jul. 2, 2009

(51) Int. Cl.
*H04B 1/04* (2006.01)
(52) U.S. Cl. ............ 455/127.1; 455/253.2; 455/522; 330/129
(58) Field of Classification Search ........... 455/127.1, 455/253.2, 522; 330/129
See application file for complete search history.

(56) References Cited

U.S. PATENT DOCUMENTS

| 6,639,465 | B2 * | 10/2003 | Samelis et al. | 330/129 |
| 6,765,439 | B2 * | 7/2004 | Choi | 330/129 |
| 7,043,213 | B2 * | 5/2006 | Robinson et al. | 455/127.2 |
| 7,382,194 | B2 * | 6/2008 | Apel | 330/295 |
| 2007/0010218 | A1 * | 1/2007 | Monroe et al. | 455/127.1 |

* cited by examiner

*Primary Examiner*—Nhan Le
(74) *Attorney, Agent, or Firm*—Shiloh et al.

(57) ABSTRACT

Device, system, and method of providing biasing power. For example, an apparatus includes a voltage-controlled current source to provide biasing current to a Radio Frequency power amplifier based on a voltage of an incoming signal indicating a command to activate the Radio Frequency power amplifier, the incoming signal received from a Radio Frequency baseband module; and a current-reducing circuit to reduce the biasing current if the voltage of the incoming signal is greater than or equal to a voltage overdrive threshold.

14 Claims, 3 Drawing Sheets

DEVICE, SYSTEM, AND METHOD OF PROVIDING BIASING POWER

BACKGROUND

A wireless communication device may include a wireless transceiver having a Power Amplifier (PA). A baseband module or a Radio Frequency Integrated Circuit (RFIC) may request to turn on the PA, by providing a triggering voltage which triggers a voltage-controlled current source to provide biasing current to the PA. For example, the triggering voltage may be approximately 2.8 volts.

Unfortunately, voltage variations may modify and increase the triggering voltage, for example, from 2.8 volts to 3.6 volts. Accordingly, the increased triggering voltage ("voltage overdrive") may cause the voltage-controlled current source to provide an increased biasing current to the PA. This may cause the PA to produce an increased gain, for example, above the gain that the system requires to receive from the PA.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
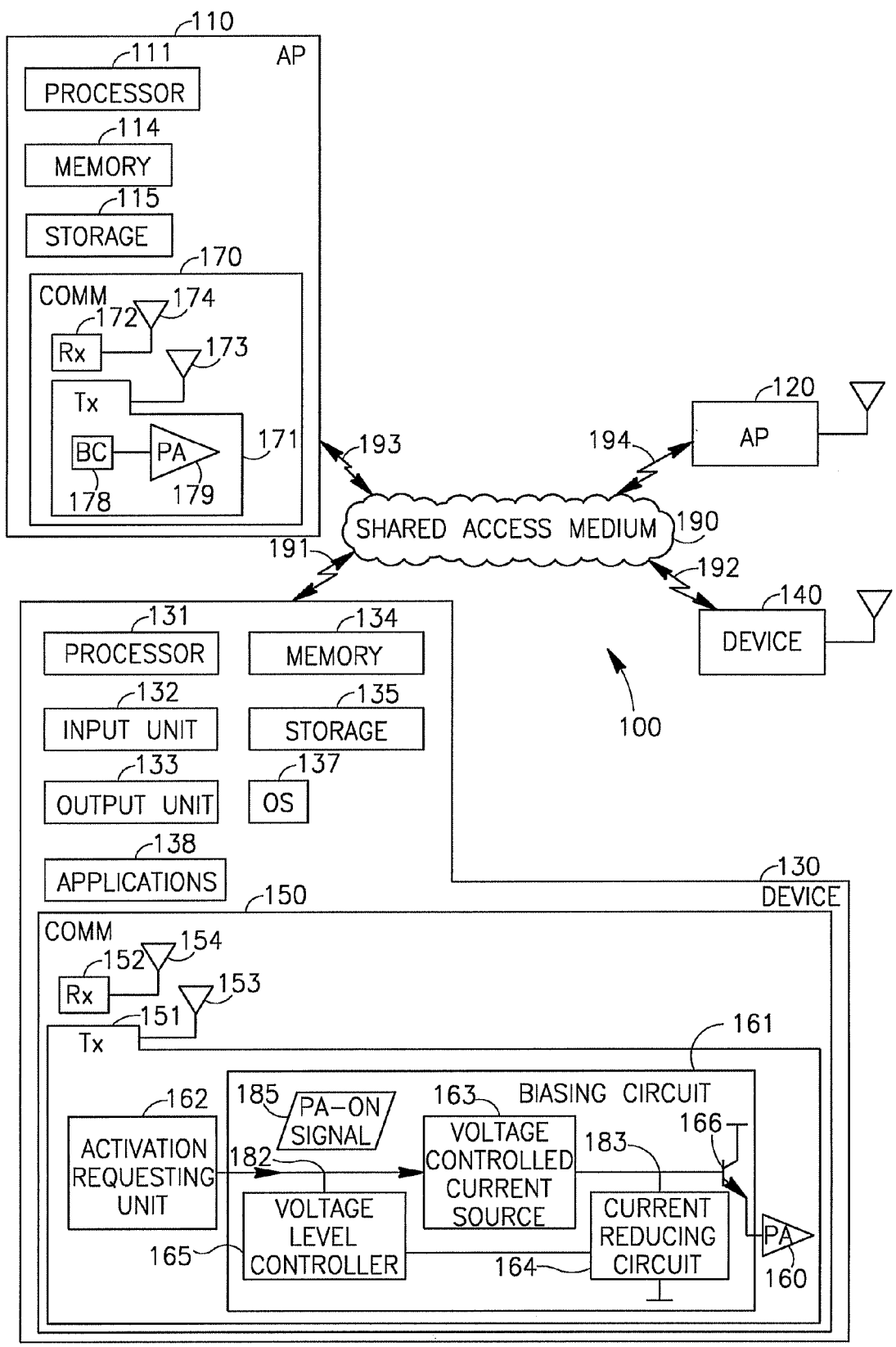
FIG. 1 is a schematic block diagram illustration of a wireless communication system in accordance with a demonstrative embodiment of the invention.

In the following detailed description, numerous specific details are set forth in order to provide a thorough understanding of some embodiments of the invention. However, it will be understood by persons of ordinary skill in the art that embodiments of the invention may be practiced without these specific details. In other instances, well-known methods, procedures, components, units and/or circuits have not been described in detail so as not to obscure the discussion.

Discussions herein utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality" as used herein includes, for example, "multiple" or "two or more". For example, "a plurality of items" includes two or more items.

Although portions of the discussion herein relate, for demonstrative purposes, to wired links and/or wired communications, embodiments of the invention are not limited in this regard, and may include one or more wired or wireless links, may utilize one or more components of wireless communication, may utilize one or more methods or protocols of wireless communication, or the like. Some embodiments of the invention may utilize wired communication and/or wireless communication.

Some embodiments of the invention may be used in conjunction with various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a non-mobile or non-portable device, a wireless communication station, a wireless communication device, a wireless Access Point (AP), a wired or wireless router, a wired or wireless modem, a wired or wireless network, a Local Area Network (LAN), a Wireless LAN (WLAN), a Metropolitan Area Network (MAN), a Wireless MAN (WMAN), a Wide Area Network (WAN), a Wireless WAN (WWAN), a Personal Area Network (PAN), a Wireless PAN (WPAN), devices and/or networks operating in accordance with existing IEEE 802.11, 802.11a, 802.11b, 802.11g, 802.11k, 802.11n, 802.11r, 802.16, 802.16d, 802.16e, 802.20, 802.21 standards and/or future versions and/or derivatives of the above standards, units and/or devices which are part of the above networks, one way and/or two-way radio communication systems, cellular radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device (e.g., BlackBerry, Palm Treo), a Wireless Application Protocol (WAP) device, or the like.

Some embodiments of the invention may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth (RTM), Global Positioning System (GPS), Wi-Fi, Wi-Max, ZigBee (TM), Ultra-Wideband (UWB), Global System for Mobile communication (GSM), 2G, 2.5G, 3G, 3.5G, Enhanced Data rates for GSM Evolution (EDGE), or the like. Embodiments of the invention may be used in various other devices, systems and/or networks.

FIG. 1 schematically illustrates a block diagram of a wireless communication system 100 in accordance with some demonstrative embodiments of the invention. System 100 may include one or more wireless communication devices, for example, wireless communication devices 130 and 140, as well as one or more wireless Access Points (APs), for example, APs 110 and 120. The components of system 100 may communicate using a shared access medium 190, for example, using wireless links 191-194.

Device 130 and/or device 140 may be or may include, for example, a mobile phone, a cellular phone, a handheld device, a computing device, a computer, a Personal Computer (PC), a server computer, a client/server system, a mobile computer, a portable computer, a laptop computer, a notebook computer, a tablet computer, a network of multiple inter-connected devices, or the like.

Device 130 may include, for example, a processor 131, an input unit 132, an output unit 133, a memory unit 134, a storage unit 135, and a communication unit 150. Device 130 may optionally include other suitable hardware components and/or software components.

Processor 131 includes, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 131 executes instructions, for example, of an Operating System (OS) 137 of device 130 or of one or more applications 138.

Input unit 132 includes, for example, a keyboard, a keypad, a mouse, a touch-pad, a track-ball, a stylus, a microphone, or other suitable pointing device or input device. Output unit 133 includes, for example, a monitor, a screen, a Cathode Ray Tube (CRT) display unit, a Liquid Crystal Display (LCD) display unit, a plasma display unit, one or more audio speakers or earphones, or other suitable output devices.

Memory unit 134 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 135 includes, for example, a hard disk drive, a floppy disk drive, a Compact Disk (CD) drive, a CD-ROM drive, a Digital Versatile Disk (DVD) drive, or other suitable removable or non-removable storage units. Memory unit 134 and/or storage unit 135, for example, store data processed by device 130.

Communication unit 150 includes, for example, a wireless transceiver, a wireless modem, a wireless Network Interface Card (NIC), or the like. For example, communication unit 150 includes a transmitter 151 and a receiver 152.

Transmitter 151 includes, for example, a wireless Radio Frequency (RF) transmitter able to transmit wireless RF signals, blocks, frames, transmission streams, packets, messages and/or data, e.g., through an antenna 153.

Receiver 152 includes, for example, a wireless Radio Frequency (RF) receiver able to receive wireless RF signals, blocks, frames, transmission streams, packets, messages and/or data, e.g., through an antenna 154.

Optionally, transmitter 151 and receiver 152 may be implemented using a transceiver, a transmitter-receiver, or other suitable component. Optionally, antenna 153 and antenna 154 may be implemented using a common antenna, a common set of multiple antennas, or other suitable component(s). For example, antenna 153 and/or antenna 154 may include an internal and/or external RF antenna, a dipole antenna, a monopole antenna, an omni-directional antenna, an end fed antenna, a circularly polarized antenna, a micro-strip antenna, a diversity antenna, or other type of antenna suitable for transmitting and/or receiving wireless communication signals, blocks, frames, transmission streams, packets, messages and/or data.

In some embodiments, some or all of the components of device 130 may be enclosed in a common housing or packaging, and may be interconnected or operably associated using one or more wired or wireless links. In other embodiments, components of device 130 may be distributed among multiple or separate devices or locations.

AP 110 and/or AP 120 may be or may include, for example, a wireless AP, a wireless Base Station (BS), a wireless controller, a wireless router, a component of an ad-hoc network operating as an AP or a router, an AP of a Basic Service Set (BSS), a device operating as AP in an Independent BSS (IBSS), an AP or a device able to connect among multiple wireless communication devices, a device able to form a wireless communication network, a device able to relay among wireless communication devices, or the like.

AP 110 may include, for example, a processor 111, a memory unit 114, a storage unit 115, and a communication unit 170. The communication unit 170 may include, for example, a transmitter 171 associated with an antenna 173, and a receiver 172 associated with an antenna 174.

Device 140 may include components similar, in properties and/or in functionality, to the components of device 130. AP 120 may include components similar, in properties and/or in functionality, to the components of AP 110.

In some embodiments, system 100 may include one or more wireless communication networks, for example, an a-synchronic wireless network, an asynchronous wireless network, a synchronic wireless network, a synchronous wireless network, a burstable wireless network, a non-burstable wireless network, a hybrid wireless network, a combination of one or more wireless networks, or the like.

In some embodiments, device 130 includes a Power Amplifier (PA) 160, for example, as part of the transmitter 151. The PA 160 includes, or is associated with, a biasing circuit 161 which provides biasing power (e.g., biasing voltage or biasing current) to the PA 160. An activation requesting unit 162 (e.g., a baseband module or a Radio Frequency Integrated Circuit (RFIC)) may request to turn on the PA 160. For example, the activation requesting unit 162 provides a "PA-ON" signal 185, e.g., a triggering voltage (for example, 2.8 volts). The triggering voltage triggers a voltage-controlled current source 163 to provide biasing current to the PA 160, for example, through a Bipolar Junction Transistor (BJT) 166.

If the voltage of the PA-ON signal 185 is greater than a pre-defined threshold (e.g., greater than 3.0 volts), then a current reducing circuit 164 is activated to reduce the biasing current provided by the voltage-controlled current source 163. Accordingly, the current reducing circuit 164 operates to consume a portion of the biasing power that the voltage-controlled current source 163 outputs. For example, current reducing circuit 164 is connected to a node 183, located between the output of the voltage-controlled current source 163 and the BJT 166. The current reducing circuit 164 may include, for example, a transistor bank, a set or bank of transistors, a current reducing circuit, a voltage regulating circuit, a current "bleed" circuit, a voltage "bleed" circuit, a current reducer, a voltage reducer, or other units able to consume a portion of the voltage or current produced by the voltage-controlled current source 163.

Optionally, a voltage level controller 165 is connected at a node 182 and receives the PA-ON signal 185. The voltage level controller 165 may include, for example, a potential divider or a voltage divider. The voltage level controller 165 checks whether the voltage of the PA-ON signal 185 is greater than a pre-defined threshold (e.g., greater than 3.0 volts). If the voltage of the PA-ON signal 185 is greater than the pre-defined threshold, then the voltage level controller 165 activates the current reducing circuit 164. If the voltage of the PA-ON signal 185 is not greater than the pre-defined threshold, then the voltage level controller 165 deactivates the current reducing circuit 164.

Some embodiments are thus able to handle voltage overdrive of the PA-ON signal 185. In some embodiments, biasing circuit 161 utilizes two threshold values: a first threshold value (e.g., 2.8 volts) is used to determine whether or not the voltage-controlled current source 163 is to provide biasing voltage to the PA 160; and a second, greater, threshold value (e.g., 3.0 volts) is used to determine whether or not the current reducing circuit 164 is to be activated and to consume some of the biasing current produced by the voltage-controlled current source 163.

Accordingly, biasing circuit 161 may have three states of operation. In a first state, the voltage of the PA-ON signal 185 is lower than the first threshold (2.8 volts), and is also lower than the second threshold (3.0 volts). In this state, the PA 160 is not required to be activated; hence, the voltage-controlled current source 163 does not provide biasing current, and the current reducing circuit 164 is deactivated or turned-off.

In a second state, the voltage of the PA-ON signal 185 is equal to or greater than the first threshold (2.8 volts), but smaller than the second threshold (3.0 volts). In this state, the PA 160 is required to be activated, and hence the voltage-controlled current source 163 provides biasing current. Since the "voltage overdrive" is relatively small or insignificant, the current reducing circuit 164 is deactivated or turned-off.

In a third state, the voltage of the PA-ON signal 185 is greater than the first threshold (2.8 volts), and is also greater than the second threshold (3.0 volts). In this state, the PA 160 is required to be activated, and hence the voltage-controlled current source 163 provides biasing current. However, since the "voltage overdrive" is significant, the current reducing circuit 164 is activated, and operates to consume a portion of the biasing current provided by the voltage-controlled current source 163. The current reducing circuit 164 thus reduces the effective biasing current that the PA 160 receives, thereby avoiding a voltage overdrive which may increase the gain of the PA 160 beyond the required gain or the allowed gain.

Some embodiments thus maintain or sustain the performance of the PA 160 over changes in the voltage of the PA-ON signal 185 supplied to the die. For example, even if the voltage of the PA-ON signal varies (e.g., from 2.8 volts to 3.6 volts), the performance of the PA 160 is maintained, with substantially no variations or with minimal variations. Accordingly, even if the voltage of the PA-ON signal 185 is further increased, through temperature and/or voltage variations, the biasing current supplied is maintained at a substantially constant level. Some embodiments thus reduce or mitigate changes in RF performance over voltage variations.

In some embodiments, AP 110 may include a PA 179, for example, as part of the transmitter 171. The PA 179 includes, or is associated with, a biasing circuit 178 which provides biasing power (e.g., biasing voltage or biasing current) to the PA 179. In some embodiments, PA 179 of the AP 110 may be similar to PA 160 of device 130; and biasing circuit 178 of the AP 110 may be similar to biasing circuit 161 of device 130.

Although portions of the discussion herein relate, for demonstrative purposes, to voltage-controlled current source 163 and to current-reducing circuit 164, some embodiments of the invention may be used in conjunction with a voltage-controlled voltage source, a voltage-reducing circuit, or other suitable units.

Figure 2:
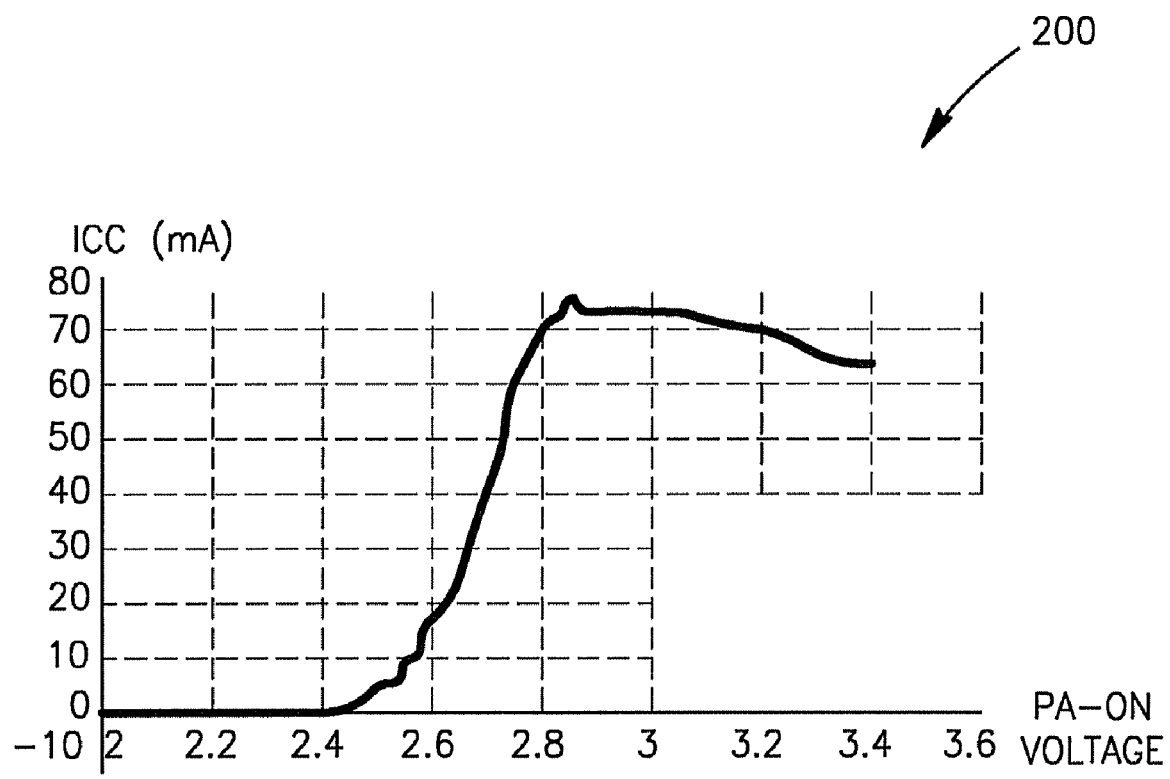
FIG. 2 is a chart of current drawn by a PA as a function of the voltage of a PA-ON signal in accordance with a demonstrative embodiment of the invention.

FIG. 2 illustrates a chart 200 of current (e.g., drawn by a PA or by a chip) as a function of the voltage of the PA-ON signal. In chart 200, the vertical axis (denoted Icc) indicates the drawn current (e.g., in milliAmperes), whereas the horizontal axis indicates the voltage of the PA-ON signal (e.g., in Volts). The current characteristic graph of chart 200 indicates demonstrative results which may be achieved by utilizing a demonstrative implementation of an embodiment of the invention, e.g., utilizing a system similar to system 100 of FIG. 1; other results and/or other graphs may be obtained by utilizing embodiments of the inventions.

As demonstrated in chart 200, when the voltage of the PA-ON signal is in the range of zero volts to approximately 2.5 volts, the current drawn by the PA is substantially zero milliAmperes. Then, when the voltage of the PA-ON signal gradually increases from approximately 2.5 volts to approximately 2.8 volts (the first threshold, namely, the threshold that triggers the voltage-controlled current source), the current drawn by the PA gradually increases as well, and reaches approximately 70 milliAmperes. Subsequently, when the voltage of the PA-ON signal gradually increases from approximately 2.8 volts (the first threshold) to approximately 2.9 volts (the second threshold, namely, the threshold that triggers the current reducing circuit), the current drawn by the PA gradually increases as well, and reaches approximately 76 milliAmperes. However, once the voltage of the PA-ON signal reaches and passes approximately 2.9 volts (the second threshold), the current drawn by the PA is restricted by the current reducing circuit to maintain a relatively constant gain. Optionally, further reduction in the current drawn by the PA may result if the voltage of the PA-ON signal further increases, due to the operation of the current reducing circuit.

As demonstrated in chart 200, the nominal voltage of the PA-ON signal is intended for operation at 2.8 volts. As the voltage increases, the current reducing circuit acts to bring back the PA performance to nominal operation, and hence the reduction in current draw.

Figure 3:
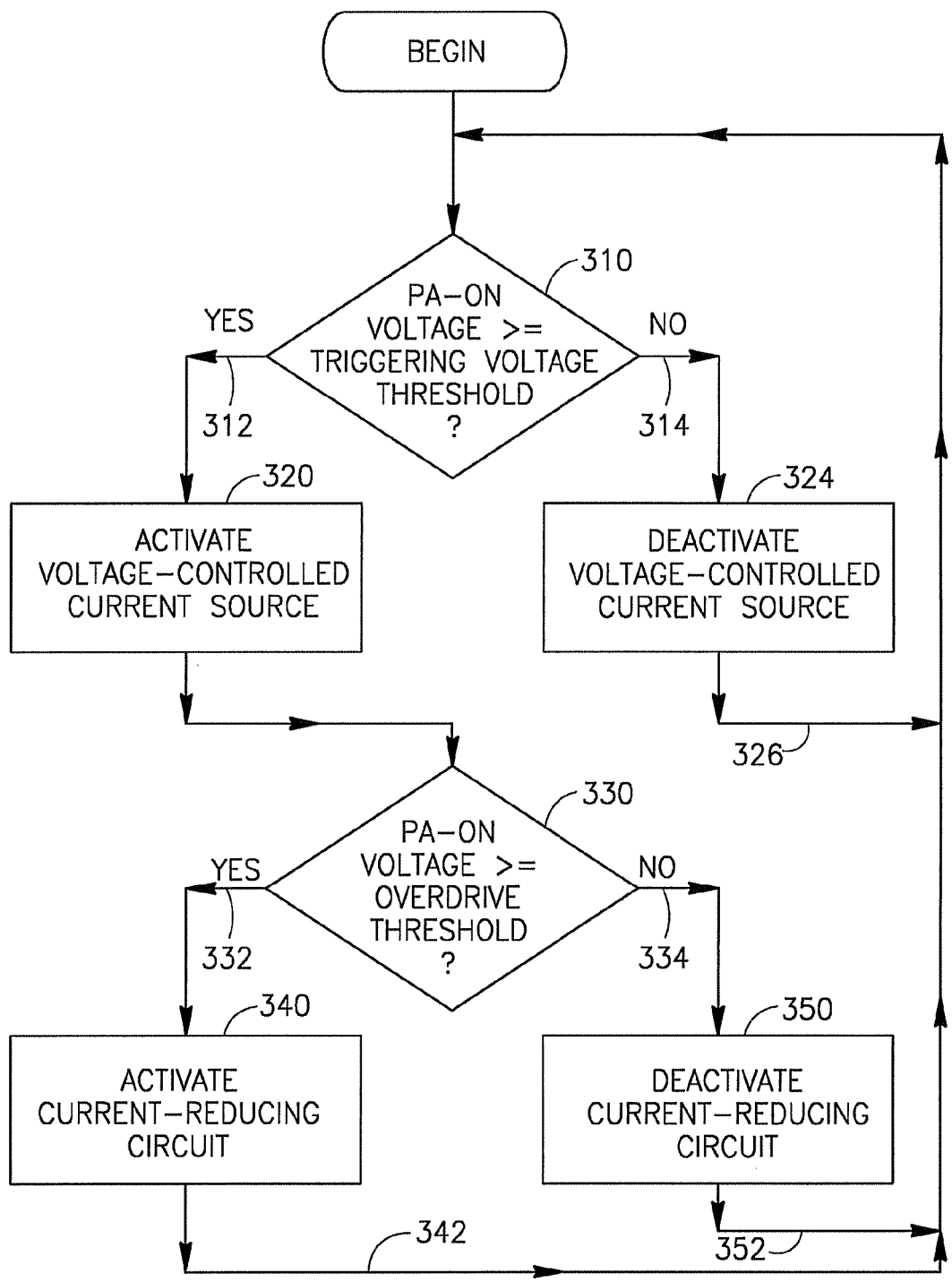
FIG. 3 is a schematic flow-chart of a method of providing biasing power in accordance with a demonstrative embodiment of the invention.

FIG. 3 is a schematic flow-chart of a method of providing biasing power in accordance with some demonstrative embodiments of the invention. Operations of the method may be used, for example, by system 100 of FIG. 1 and/or by other suitable units, devices and/or systems.

In some embodiments, the method may include, for example, checking whether a PA-ON voltage is greater than or equal to a first threshold, namely, a threshold that triggers the voltage-controlled current source (block 310). The first threshold may be referred to as "triggering voltage threshold" or "PA-ON voltage threshold" or "voltage-controlled current source activation voltage".

If the PA-ON voltage is greater than or equal to the first threshold (arrow 312), then the method may include, for example, activating the voltage-controlled current source to provide biasing current to the PA (block 320).

In contrast, if the PA_ON voltage is smaller than the first threshold (arrow 314), then the method may include, for example, deactivating the voltage-controlled current source (block 324). Optionally, the operations of block 310 and onward may be repeated (arrow 326).

In some embodiments, the method may include, for example, checking whether the PA-ON voltage is greater than or equal to a second threshold, namely, a threshold that triggers activation of the current reducing circuit or other voltage regulating sub-unit (block 330). The second threshold is greater than the first threshold, e.g., approximately (or at least) 5 percent greater, approximately (or at least) 8 percent greater, approximately (or at least) 10 percent greater, approximately (or at least) 15 percent greater, approximately (or at least) 20 percent greater, approximately (or at least) 25 percent greater, or the like. The second threshold may be referred to as "PA-ON overdrive voltage threshold" or "current reducing circuit activation voltage" or "current reducing circuit triggering voltage".

If the PA-ON voltage is greater than or equal to the second threshold (arrow 332), then the method may include, for example, activating the current reducing circuit (block 340). Optionally, the operations of block 310 and onward may be repeated (arrow 342).

In contrast, if the PA-ON voltage is smaller than the second threshold (arrow 334), then the method may include, for example, deactivating the current reducing circuit (block 350). Optionally, the operations of block 310 and onward may be repeated (arrow 352).

Other suitable operations may be used, and other suitable orders of operation may be used. In some embodiments, operations may be repeated, for example, substantially continuously, for a pre-defined number of iterations, at pre-defined time intervals, or the like.

Some embodiments of the invention, for example, may take the form of an entirely hardware embodiment, an entirely software embodiment, or an embodiment including both hardware and software elements. Some embodiments may be implemented in software, which includes but is not limited to firmware, resident software, microcode, or the like.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, the medium may be an electronic, magnetic, optical, electromagnetic, infrared, or semiconductor system (or apparatus or device) or a propagation medium. Some demonstrative examples of a computer-readable medium may include a semiconductor or solid state memory, magnetic tape, a removable computer diskette, a random access memory (RAM), a read-only memory (ROM), a rigid magnetic disk, and/or an optical disk. Some demonstrative examples of optical disks include compact disk-read only memory (CD-ROM), compact disk-read/write (CD-R/W), and DVD.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other suitable components may be used.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. An apparatus comprising:
   a voltage-controlled current source to provide biasing current to a Radio Frequency power amplifier based on a voltage of an incoming signal indicating a command to activate the Radio Frequency power amplifier, the incoming signal received from a Radio Frequency baseband module; and
   a current-reducing circuit to reduce the biasing current if the voltage of the incoming signal is greater than or equal to a voltage overdrive threshold.

2. The apparatus of claim 1, wherein the current-reducing circuit is connected between the voltage-controlled current source and the Radio Frequency power amplifier.

3. The apparatus of claim 1, wherein the current-reducing circuit comprises one or more transistors.

4. The apparatus of claim 1, comprising:
   a voltage level controller to receive the incoming signal, to check whether the voltage of the incoming signal is greater than or equal to the voltage overdrive threshold, and to activate the current-reducing circuit if the voltage of the incoming signal is greater than or equal to the voltage overdrive threshold.

5. The apparatus of claim 4, wherein the voltage level controller is to deactivate the current-reducing circuit if the voltage of the incoming signal is smaller than the voltage overdrive threshold.

6. The apparatus of claim 1, wherein the overdrive voltage threshold is at least ten percent greater than the triggering voltage threshold.

7. The apparatus of claim 1, wherein the incoming signal comprises a signal generated by a Radio Frequency Integrated Circuit.

8. The apparatus of claim 1, wherein the apparatus comprises a device selected from a group consisting of:
   a Radio Frequency transmitter, a Radio Frequency transceiver, a wireless communication device, a wireless communication station, a wireless Access Point, and a wireless Base Station.

9. A method comprising:
   receiving from a Radio Frequency baseband module a signal indicating a request to activate a Radio Frequency power amplifier;
   if a voltage of the signal is greater than or equal to a triggering voltage threshold, activating a voltage-controlled current source connected to the Radio Frequency power amplifier; and
   if the voltage of the signal is greater than or equal to an overdrive voltage threshold, activating a current-reducing circuit associated with the voltage-controlled current source.

10. The method of claim 9, wherein activating the current-reducing circuit comprises activating a current-reducing circuit connected between the voltage-controlled current source and the Radio Frequency power amplifier.

11. The method of claim 10, wherein activating the current-reducing circuit comprises activating the current-reducing circuit based on a command received from a voltage level controller.

12. The method of claim 9, comprising:
   deactivating the current-reducing circuit if the voltage of the signal is smaller than the overdrive voltage threshold.

13. The method of claim 9, wherein the receiving comprises:
   receiving the signal from a Radio Frequency Integrated Circuit.

14. The method of claim 9, wherein the overdrive voltage threshold is at least fifteen percent greater than the triggering voltage threshold.

* * * * *